(12) United States Patent
Gee et al.

(10) Patent No.: US 7,335,555 B2
(45) Date of Patent: Feb. 26, 2008

(54) BURIED-CONTACT SOLAR CELLS WITH SELF-DOPING CONTACTS

(75) Inventors: James M. Gee, Albuquerque, NM (US); Peter Hacke, Albuquerque, NM (US)

(73) Assignee: Advent Solar, Inc., Albuquerque, NM (US)

( * ) Notice: Subject to any disclaimer, the term of this patent is extended or adjusted under 35 U.S.C. 154(b) by 95 days.

(21) Appl. No.: 11/050,182

(22) Filed: Feb. 3, 2005

(65) Prior Publication Data

US 2005/0172998 A1 Aug. 11, 2005

Related U.S. Application Data

(60) Provisional application No. 60/542,454, filed on Feb. 5, 2004, provisional application No. 60/542,390, filed on Feb. 5, 2004.

(51) Int. Cl.
*H01L 21/8242* (2006.01)

(52) U.S. Cl. .......................... 438/253; 438/57; 438/97; 438/98; 257/E21.384

(58) Field of Classification Search ............. None
See application file for complete search history.

(56) References Cited

U.S. PATENT DOCUMENTS

| | | |
|---|---|---|
| 3,903,427 A | 9/1975 | Pack |
| 3,903,428 A | 9/1975 | DeJong |
| 3,936,319 A | 2/1976 | Anthony et al. |
| 4,032,960 A | 6/1977 | Anthony et al. |
| 4,056,879 A | 11/1977 | Lindmayer |
| 4,065,742 A * | 12/1977 | Kendall et al. ................ 338/9 |
| 4,152,824 A | 5/1979 | Gonsiorawski |
| 4,165,558 A | 8/1979 | Armitage et al. |
| 4,173,496 A | 11/1979 | Chiang et al. |
| 4,184,897 A | 1/1980 | Anthony et al. |
| 4,190,852 A | 2/1980 | Warner, Jr. |
| 4,227,942 A | 10/1980 | Hall |
| 4,234,352 A | 11/1980 | Swanson |

(Continued)

FOREIGN PATENT DOCUMENTS

EP 0452588 A1 10/1991

(Continued)

OTHER PUBLICATIONS

Dicker, J., et al., "Analysis of rear contacted solar cell structures for cost effective processes and materials", *Photovoltaic Specialists Conference, 2000, Conference Record of the Twenty-Eighth IEEE*, Anchorage, Alaska, (Sep. 15-22, 2000),387-390.

(Continued)

*Primary Examiner*—Michael Lebentritt
*Assistant Examiner*—Kyoung Lee
(74) *Attorney, Agent, or Firm*—Stephen A. Slusher; Philip D. Askenazy; Peacock Myers, P.C.

(57) ABSTRACT

A buried-contact solar cell, in-process buried-contact solar cell components and methods for making buried contact solar cells wherein a self-doping contact material is placed in a plurality of buried-contact surface grooves. By combining groove doping and metallization steps, the resulting solar cell is simpler and more economical to manufacture.

17 Claims, 3 Drawing Sheets

U.S. PATENT DOCUMENTS

| | | | |
|---|---|---|---|
| 4,297,391 A | 10/1981 | Lindmayer | |
| 4,427,839 A | 1/1984 | Hall | |
| 4,478,879 A | 10/1984 | Baraona et al. | |
| 4,536,607 A | 8/1985 | Wiesmann | |
| 4,595,790 A | 6/1986 | Basol | |
| 4,626,613 A | 12/1986 | Wenham et al. | |
| 4,663,828 A | 5/1987 | Hanak | |
| 4,663,829 A | 5/1987 | Hartman et al. | |
| 4,667,058 A | 5/1987 | Catalano et al. | |
| 4,667,060 A | 5/1987 | Spitzer | |
| 4,726,850 A | 2/1988 | Wenham et al. | |
| 4,748,130 A * | 5/1988 | Wenham et al. | 438/98 |
| 4,751,191 A | 6/1988 | Gonsiorawski et al. | |
| 4,838,952 A * | 6/1989 | Dill et al. | 136/256 |
| 4,927,770 A | 5/1990 | Swanson | |
| 5,011,565 A | 4/1991 | Dube et al. | |
| 5,011,782 A | 4/1991 | Lamb et al. | |
| 5,053,083 A | 10/1991 | Sinton | |
| 5,053,355 A | 10/1991 | von Campe | |
| 5,067,985 A | 11/1991 | Carver et al. | |
| 5,103,268 A | 4/1992 | Yin et al. | |
| 5,118,362 A | 6/1992 | St. Angelo et al. | |
| 5,178,685 A | 1/1993 | Borenstein et al. | |
| 5,258,077 A | 11/1993 | Shahryar | |
| 5,266,126 A | 11/1993 | Deguchi | |
| 5,425,816 A | 6/1995 | Cavicchi et al. | |
| 5,468,652 A | 11/1995 | Gee | |
| 5,494,832 A | 2/1996 | Lehmann et al. | |
| 5,547,516 A | 8/1996 | Luch | |
| 5,593,901 A | 1/1997 | Oswald et al. | |
| 5,595,607 A | 1/1997 | Wenham et al. | |
| 5,641,362 A | 6/1997 | Meier | |
| 5,646,397 A | 7/1997 | Wenham et al. | |
| 5,797,998 A | 8/1998 | Wenham et al. | |
| 5,871,591 A | 2/1999 | Ruby et al. | |
| 5,899,704 A | 5/1999 | Schlosser et al. | |
| 5,928,438 A | 7/1999 | Salami et al. | |
| 5,942,050 A | 8/1999 | Green et al. | |
| 5,951,786 A | 9/1999 | Gee et al. | |
| 5,972,732 A | 10/1999 | Gee et al. | |
| 5,981,868 A | 11/1999 | Kushiya et al. | |
| 5,990,415 A | 11/1999 | Green et al. | |
| 6,048,442 A | 4/2000 | Kushiya et al. | |
| 6,069,313 A | 5/2000 | Kay | |
| 6,081,017 A | 6/2000 | Kim et al. | |
| 6,091,021 A | 7/2000 | Ruby et al. | |
| 6,092,669 A | 7/2000 | Kushiya et al. | |
| 6,143,976 A | 11/2000 | Endroes | |
| 6,162,658 A | 12/2000 | Green et al. | |
| 6,175,141 B1 | 1/2001 | Hofbauer et al. | |
| 6,180,869 B1 | 1/2001 | Meier et al. | |
| 6,184,056 B1 | 2/2001 | Nakamura et al. | |
| 6,184,057 B1 | 2/2001 | Van Andel et al. | |
| 6,210,991 B1 | 4/2001 | Wenham et al. | |
| 6,262,359 B1 | 7/2001 | Meier et al. | |
| 6,384,316 B1 | 5/2002 | Shinohara et al. | |
| 6,384,317 B1 | 5/2002 | Kerschaver et al. | |
| 6,420,647 B1 | 7/2002 | Ji et al. | |
| 6,429,037 B1 | 8/2002 | Wenham et al. | |
| 6,441,297 B1 | 8/2002 | Keller et al. | |
| 6,538,195 B1 | 3/2003 | Shi et al. | |
| 6,559,479 B1 | 5/2003 | Luedemann | |
| 6,559,497 B2 | 5/2003 | Shih et al. | |
| 6,613,653 B2 | 9/2003 | Naseem et al. | |
| 6,632,730 B1 | 10/2003 | Meier et al. | |
| 6,664,631 B2 | 12/2003 | Meier et al. | |
| 6,703,295 B2 | 3/2004 | Meier et al. | |
| 6,734,037 B1 | 5/2004 | Fath et al. | |
| 6,737,340 B2 | 5/2004 | Meier et al. | |
| 6,777,729 B1 | 8/2004 | Prince et al. | |
| 6,846,984 B2 | 1/2005 | Fath et al. | |
| 2002/0011641 A1 | 1/2002 | Oswald | |
| 2002/0117199 A1 | 8/2002 | Oswald | |
| 2002/0119592 A1 | 8/2002 | Oswald et al. | |
| 2003/0003693 A1 | 1/2003 | Meier et al. | |
| 2003/0008485 A1 | 1/2003 | Meier et al. | |
| 2003/0037815 A1 | 2/2003 | Kim et al. | |
| 2003/0044539 A1 | 3/2003 | Oswald | |
| 2003/0089393 A1 | 5/2003 | Fath et al. | |
| 2003/0102022 A1 | 6/2003 | Fath et al. | |
| 2003/0116185 A1 | 6/2003 | Oswald et al. | |
| 2003/0143827 A1 | 7/2003 | Wenham et al. | |
| 2003/0180983 A1 | 9/2003 | Oswald et al. | |
| 2003/0203603 A1 | 10/2003 | Meier et al. | |
| 2004/0187916 A1 | 9/2004 | Hezel | |
| 2004/0200520 A1 | 10/2004 | Mulligan et al. | |
| 2004/0219801 A1 | 11/2004 | Oswald et al. | |
| 2004/0261839 A1 | 12/2004 | Gee et al. | |
| 2004/0261840 A1 | 12/2004 | Schmit et al. | |
| 2005/0115604 A1 | 6/2005 | Fath et al. | |

FOREIGN PATENT DOCUMENTS

| | | |
|---|---|---|
| JP | 60000783 | 1/1985 |
| JP | 63202378 | 2/1990 |
| WO | WO 93/24960 | 12/1993 |
| WO | WO 2004/100244 A1 | 11/2004 |

OTHER PUBLICATIONS

Duerinckx, F., et al., "Improved Screen Printing Process for Very Thin Multicrystalline Silicon Solar Cells", *presented at the 19th EPVSEC, Paris*, (2004).

Eikelboom, D.W.K., et al., "Conductive Adhesives for Interconnection of Busbarless Emitter Wrap-Through Solar Cells on a Structured Metal Foil", *presented at the 17th European Photovoltaic Solar Energy Conference, Munich, Germany, Oct. 22-26, 2001*, (Oct. 2001).

Gee, James M., et al., "Back-Contact Crystalline-Silicon Solar Cells and Modules", *NCPV Program Review Meeting*, (Sep. 8-11, 1998), 1-6.

Gee, J. M., et al., "Emitter wrap-through solar cell", *Photovoltaic Specialists Conference 1993, Conference Record of the Twenty Third IEEE, Louisville, Kentucky*, (May 10-14, 1993),265-270.

Gee, James M., et al., "Progress on the Emitter Wrap-Through Silicon Solar Cell", *12th European Photovoltaic Solar Energy Conference, Amsterdam*,(Apr. 1994).

Gee, James M., et al., "Simplified Module Assembly Using Back-Contact Crystalline-Silicon Solar Cells", *26th IEEE Photovoltaic Specialists Conference*, (1998),1085-1088.

Gee, James M., et al., "Simplified Module Assembly Using Back-Contact Crystalline-Silicon Solar Cells", *presented at the 26th IEEE Photovoltaic Specialists Conference, Sep. 29-Oct. 3, 1997, Anaheim, California*, (Sep. 1997).

Gee, James M., et al., "Towards a Manufacturable Back-Contact Emitter-Wrap-Through Silicon Solar Cell", *31st IEEE Photovoltaic Specialists Conference, Orlando, Florida*,(Jan. 2005),3-7.

Hacke, Peter, et al., "Application of Boron Source Diffusion Barrier for the Fabrication of Back Cotnact Silicon Solar Cells", *31st IEEE Photovoltaic Specialists Conference, Orlando, Florida*,(Jan. 2005),3-7.

Hacke, Peter, et al., "Poster for "Application of a Boron Source Diffusion Barrier for the Fabrication of Back Contact Silicon Solar Cells"", *31st IEEE Photovoltaic Specialist Conference, Orlando, Florida*(Jan. 2005),3-7.

Hilai, M., et al., "Optimization of Self-Doping Ag Paste Firing to Achieve High Fill Factors on Screen-Printed Silicon Solar Cells with a 100 ohm/sq. Emitter", *29th IEEE Photovoltaic Specialists Conference, New Orleans, Louisiana*,(May 2002),356-359.

Meier, D.L., et al., "Self-Doping Contacts to Silicon Using Silver Coated with a Dopant Source", *28th IEEE Photovoltaic Specialists Conference*, (2000),69-74.

Neu, W., "Low-cost multicrystalline back-contact silicon solar cells with screen printed metallization", *Elsevier Solar Energy Materials & Solar Cells*, (2002),139-146.

Pritchard, Stephen C., "A Comparison of Single Junction and Transistor Structure Solar Cells", *Proceedings of Solar '97, Paper 112*, Australian and New Zealand Solar Energy Society,(1997).

Schneider, A., et al., "AL BSF for Thin Screenprinted Multicrystalline SI Solar Cells", *presented at the 17th Eur. PV Solar Energy Conf., Munich*, (Oct. 2001).

Schneider, A., et al., "Bow Reducing Factors for Thin Screenprinted MC-SI Solar Cells with AL BSF", *presented at the 29th IEEE Photovolatic Specialists Conference, New Orleans, LA*, (336).

Schoenecker, A., et al., "Ace Designs: The Beauty of Rear Contact Solar Cells", *Presented at the 29th IEEE Photovolatic Specialists Conference, May 20-24, 2004, New Orleans, USA*, (May 2002).

Schoenecker, A., et al., "Advanced Crystalline Silicon Solar Cell Designs (ACE)", *Final Report of European Commission project*, JOR3-CT98-0269.

Schoenecker, A., et al., "An Industrial Multi-Crystalline EWT Solar Cell with Screen Printed Metallisation", *14th Eur. Photovoltaic Solar Energy Conference and Exhibition*, Barcelona, Spain,(1997).

Smith, David D., et al., "Circuit Modeling of the Emitter-Wrap-Through Solar Cell", *IEEE Transactions on Electron Devices*, vol. 46, No. 10,(Oct. 1999).

Smith, D., "Emitter-Wrap Through Solar Cells With Screen-Printed Contacts", *NCPV Program Review Meeting 2000*, NREL Report No. BK-520-28064,(Apr. 16-19, 2000),307.

Smith, David D., et al., "Review of Back Contact Silicon Solar Cells for Low Cost Application", *16th Eur. Photovoltaic Solar Energy Conference and Exhibition*, Glasgow, United Kingdom,(1999).

Tool, C.J.J., et al., "Effect of Wafer Thickness on the Performance of mc-Si Solar Cells", *presented at the 17th European Photovoltaic Solar Energy Conference, Munich*, (2001).

Verlinden, P., et al., "Multilevel Metallization for Large Area Point-Contact Solar Cells", *IEEE*, (1988),532-537.

* cited by examiner

BURIED-CONTACT SOLAR CELLS WITH SELF-DOPING CONTACTS

CROSS-REFERENCE TO RELATED APPLICATIONS

This application claims the benefit of the filing of U.S. Provisional Patent Application Ser. No. 60/542,454, entitled "Process for Fabrication of Buried-Contact Cells Using Self-Doping Contacts", filed on Feb. 5, 2004, and of U.S. Provisional Patent Application Ser. No. 60/542,390, entitled "Fabrication of Back-Contact Silicon Solar Cells", filed on Feb. 5, 2004. This application is related to U.S. patent application Ser. No. 11/050,184, entitled "Contact Fabrication of Emitter Wrap-Through Back Contact Silicon Solar Cells", by Peter Hacke and James M. Gee, filed concurrently herewith, and U.S. patent application Ser. No. 11/050,185, entitled "Back-Contact Solar Cells and Methods for Fabrication", by James M. Gee and Peter Hacke, also filed concurrently herewith. The specifications of all said applications are incorporated herein by reference.

BACKGROUND OF THE INVENTION

1. Field of the Invention (Technical Field)

The present invention relates to photovoltaic solar cells for the generation of electrical power directly from light, whether natural sunlight or artificial light, and more particularly, to solar cells, and methods for making solar cells, comprising contacts which are recessed into the front and/or back surfaces of the cell.

2. Background Art

Note that the following discussion refers to a number of publications and references. Discussion of such publications herein is given for more complete background of the scientific principles and is not to be construed as an admission that such publications are prior art for patentability determination purposes.

In a typical "buried-contact" silicon solar cell, the current collection grid is recessed in grooves on the front surface. By minimizing the surface area occupied by the grid contacts (i.e. grid obscuration), there is more area available for current collection. However, even though the surface contact area is less, series resistance losses do not increase because the contact area increases with respect to the depth of the contact and there is a larger cross-sectional area for the conductor. Other advantages of buried-contact cells include a heavy diffusion that is only in the buried-contact groove (reduces contact resistance and losses due to recombination of electrons and holes at the contact) and the contact metallization is selectively deposited only in the grooves. Buried-contact cells, and methods for fabricating such cells, are described in, for example, U.S. Pat. Nos. 4,726,850 and 4,748,130. High-efficiency large-area buried-contact cells have been demonstrated on both single-crystal and multicrystalline silicon substrates.

A representative process sequence for fabricating a buried-contact cell is as follows:

1. Alkaline etch
2. Light phosphorus diffusion (60 to 100 $\Omega$/sq)
3. HF etch
4. Deposit silicon nitride on front or both surfaces
5. Laser scribe and etch grooves in front surface
6. Heavy phosphorus diffusion in grooves (<20 $\Omega$/sq)
7. Deposit aluminum on rear surface
8. Alloy aluminum through rear dielectric layers
9. HF etch
10. Deposit thin layer of Ni in grooves by electroless plating
11. Sinter Ni layer
12. Deposit Cu in grooves by electroless plating As shown in FIG. 1A, a buried contact solar cell made of a silicon substrate 10 according to the prior art method comprises light phosphorus diffusion 12 over the illuminated surface, dielectric layer 18 deposited or thermally grown over the front surface, and grooves 20 subsequently applied. After fabrication of grooves 20, as shown in FIG. 1B heavy phosphorus diffusion 30 is applied, such as by means of a gaseous diffusion preferably using phosphorus oxychloride ($POCl_3$), phosphine ($PH_3$), phosphorus tribromide ($PBr_3$) or another gaseous phosphorus precursor, and an aluminum layer is applied and alloyed in a subsequent step to form an aluminum-alloyed junction 50 on rear surface of the cell. Thereafter, the heavily diffused grooves 20 are filled with metal, such as by electroless deposit of Ni thin layer 42, followed by sintering of the Ni layer and subsequent electroless deposit of Cu layer 40. The final structure, as shown in FIG. 1C, results in grooves with heavily doped (e.g. with heavy phosphorus diffusion) inner surfaces 30 to lower contact resistance and contact recombination, and metal grids or contacts 40, 42. Alternatively, a silver (Ag) metal paste may be applied to the heavily doped grooves, which is subsequently fired, as disclosed in U.S. Pat. No. 4,748,130.

Prior art buried-contact cells have a number of advantages, including a light phosphorus diffusion over the illuminated surface for high collection efficiency, a heavy phosphorus diffusion inside the grooves for low contact resistance and low contact recombination, and self alignment of the heavy phosphorus diffusion and electroless metallization to the grooves. There are some simple variations on the prior art methods, such as using a dicing saw or diamond saw rather than laser scriber to cut the grooves (although laser patterning provides finer line geometries). The primary disadvantage of the prior art process sequence is the relative complexity, time, and expense of the process. It would be advantageous to eliminate some process steps, for example the second diffusion of gaseous phosphorus into the grooves, to realize the same or an improved device structure. Further, eliminating electroless plating would be advantageous, since electroless plating involves use of hazardous chemicals that require stringent controls over wastewater treatment.

The use of self-doping metal contacts on the surface of solar cells has been described by Meier et al., U.S. Pat. No. 6,180,869. See also Daniel L. Meier, et al., "Self-doping contacts to silicon using silver coated with a dopant source," $28^{th}$ IEEE Photovoltaic Specialists Conference, pg. 69 (2000). In order to make a doped silicon layer and simultaneously provide a contact, the Ag:dopant paste can be placed directly on the silicon surface or fired through a silicon nitride layer, although in the latter case the paste must contain components which dissolve the nitride (see M. Hilali, et al., "Optimization of self-doping Ag paste firing to achieve high fill factors on screen-printed silicon solar cells with a 100 ohm/sq. emitter," $29^{th}$ IEEE Photovoltaic Specialists Conf., New Orleans, La., May 2002). However, the self-doping metal contact methods have only been applied to surfaces, and suffer from high shadowing losses due to spreading out of the self-doping paste on the surface of the cell.

BRIEF SUMMARY OF THE INVENTION

The present invention is a method for making a solar cell, the method comprising the steps of scribing at least one groove in a cell substrate, disposing a self-doping contact material within the groove, and heating the self-doping contact material, thereby simultaneously doping and metallizing the groove. The self-doping contact material preferably comprises a silicon dopant, preferably comprising phosphorus. The self-doping contact material preferably comprises silver, and is preferably a paste comprising silver particles and phosphorus. The cell substrate preferably comprises a p-type silicon substrate and the self-doping contact material preferably comprises silver and a n-type silicon dopant. Alternatively, the cell substrate comprises an n-type silicon substrate and the self-doping contact material comprises silver and a p-type silicon dopant.

The heating step preferably further comprises alloying rear contacts on a rear surface of the cell, and the rear contacts preferably comprise aluminum. In the method, scribing at least one groove preferably comprises scribing a plurality of grooves wherein the depth of the grooves is a multiple of the width of the grooves.

The present invention is also a solar cell made by the foregoing method.

The present invention is further a substrate for making a solar cell comprising a planar semiconductor substrate with a front surface and a back surface, at least one groove scribed in a surface of the semiconductor substrate, a self-doping contact material disposed within the groove. The self-doping contact material preferably comprises a paste, and preferably comprises silver. The semiconductor substrate preferably comprises crystalline silicon and the self-doping contact material comprises a silicon dopant preferably comprising phosphorus. The semiconductor substrate preferably comprises a p-type silicon substrate and the self-doping contact material preferably comprises silver and an n-type silicon dopant. The semiconductor substrate preferably further comprises a phosphorus diffusion layer on the grooved surface. The substrate of the present invention preferably further comprises an aluminum layer on the surface opposing the grooved surface.

The invention is also a solar cell comprising at least one groove and a contact disposed substantially within the groove, the contact comprising a dopant. The contact preferably comprises silver, and the dopant preferably comprises a silicon dopant, preferably comprising phosphorus.

A primary object of the present invention is to simplify the process for making buried-contact solar cells.

Another object of the present invention is to provide for simultaneous doping and formation of a metal contact in a buried-contact solar cell.

A primary advantage of the present invention is that it provides a less expensive solar cell with a minimum of grid obscuration.

Another advantage of the present invention is that it provides for elimination of numerous steps in the fabrication of a buried-contact solar cell, including elimination of heavy phosphorus diffusion steps and separate steps for electroless plating or other introduction of one or more metals to form the buried contact.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

Figure 1A:
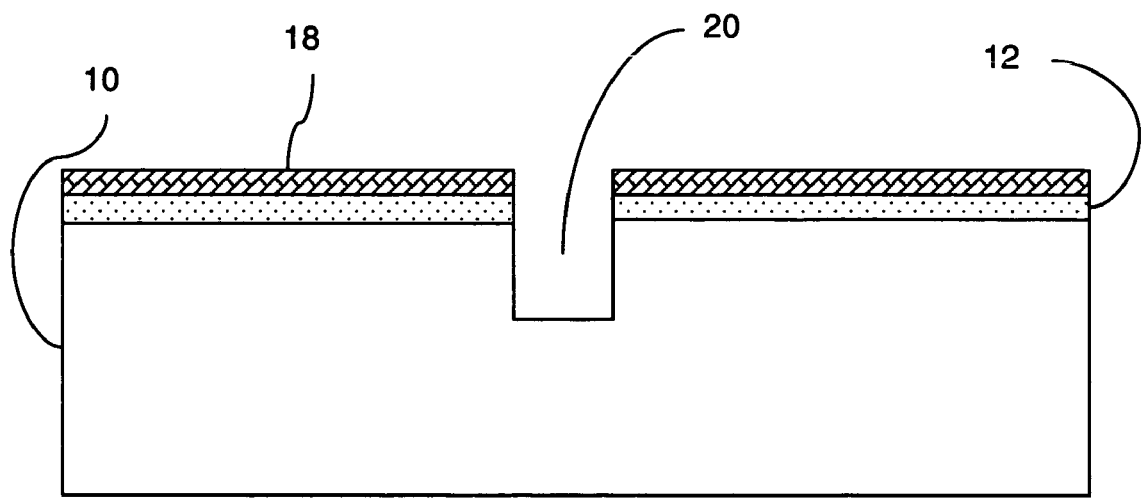
FIG. 1A depicts a cross section of a silicon substrate of the prior art in the process of fabrication into which grooves have been cut.
Figure 1B:
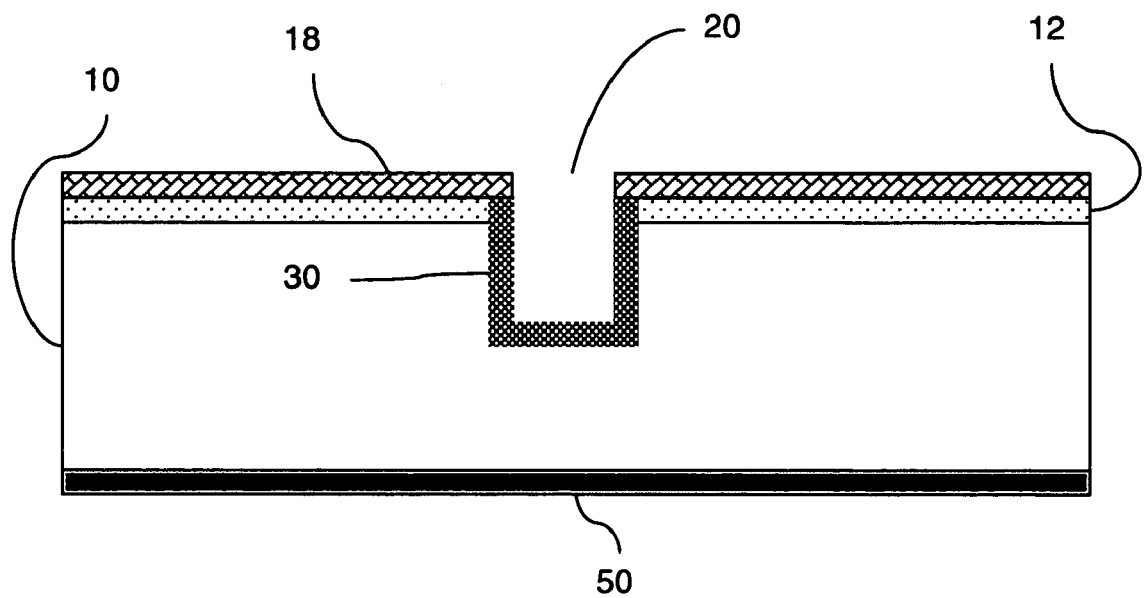
FIG. 1B depicts a prior art silicon substrate subsequent to heavy diffusion of phosphorus into the grooves.
Figure 1C:
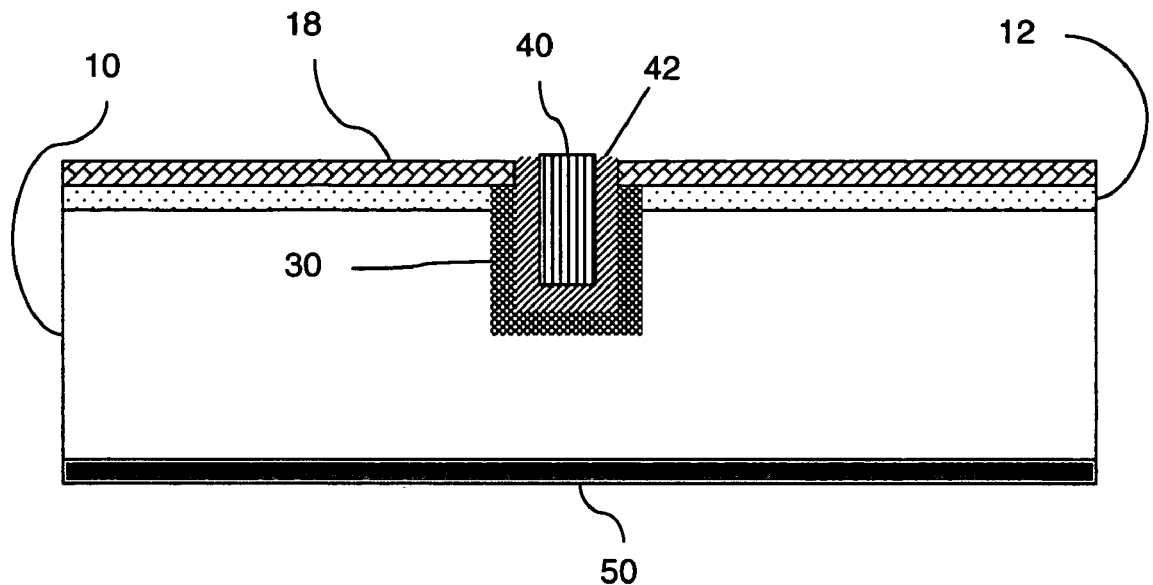
FIG. 1C depicts a prior art silicon substrate with the addition of electroless metals to form a buried-contact solar cell.

The present invention permits elimination of electroless plating sequences and provides for a simplified process for fabricating buried-contact solar cell structures, which buried-contact structures may be on either or both the front and back cell surfaces, by using a self-doping contact, including but not limited to a Ag:dopant paste.

A silicon substrate is typically multicrystalline or polycrystalline silicon, but other types of silicon substrates may be employed, including but not limited to single crystal, tricrystal, and thin crystalline-silicon films on glass or other substrates. Typically the silicon is a p-type semiconductor substrate. However, as described hereafter the invention may also be employed with n-type semiconductor substrates.

A preferred embodiment of the present invention provides a method for fabricating buried-contact cell structures that eliminates the heavy diffusion step and replaces the electroless plating sequence (two plating and one sintering) with a single print and fire sequence. This is enabled primarily by using a self-doping contact material to fill the groove. A self-doping contact material comprises both an elemental metal or alloy and a silicon dopant that dopes the silicon surface during contact formation. The silicon dopant is an n-type dopant, such as phosphorus (P), antimony (Sb), or arsenic (As), for making n-type layers. Alternatively, if the substrate is n-type, the dopant is preferably a p-type dopant, such as indium (In), aluminum (Al), boron (B), or gallium (Ga), for making p-type layers. The metal carrier preferably alloys with the silicon at a relatively low temperature and is a good conductor. The latter property allows use of the metal carrier as a grid line for conducting of current from the solar cell. Candidate materials include, for example, Ag, Al, Cu, Sn, and Au, with Ag preferred due to its noble nature (it can be fired in air with minimal oxidation), good conductivity, and compatibility with Si material processing (Ag is not a strong recombination center in Si that could degrade the solar cell efficiency).

In one preferred embodiment, the self-doping contact material is a paste, and preferably a paste containing Ag particles doped with P. The paste is applied to the grooves by any feasible means, including screen printing, a squeegee application, or other printing or deposition means. After application of the Ag:P paste, the solar cell is fired at a temperature above the Ag:Si eutectic temperature (845° C.) to produce an Ag grid with a doped contact. The Ag dissolves some of the Si at the interface when the temperature exceeds the eutectic temperature, and the precipitated silicon is doped with phosphorus when the temperature is decreased. N-type dopants other than P, such as Sb or As, can be employed, particularly but not exclusively in combination with Ag. Similarly, while use of a self-doping paste is preferred, other forms of Ag, and preferably Ag:dopant, may be employed.

In an alternative embodiment, an Ag paste or other Ag layer is applied within the groove, again by any feasible means, including screen printing, a squeegee application, or other printing or deposition means, including sputtering or evaporation. Thereafter the Ag layer is coated with a material containing an n-type dopant, such as layer containing a phosphorus compound. Alternatively, if a p-type layer is desired in the case where the substrate is n-type, the overlying layer could contain a material containing a p-type dopant, such as boron (B), indium (In), gallium (Ga), or aluminum (Al), again by any feasible means, including screen printing or other printing or deposition means, including sputtering or evaporation. The layer containing the dopant, alternatively, could be placed between the carrier metal (in this case, Ag) and the Si. The process works whereby the layer containing the dopant is dissolved into the metal-Si liquidus after the temperature is raised over the metal-Si eutectic temperature.

A paste may be made by a combination of a particle form of Ag and a dopant in liquid form, thereby creating a self-doping, screen printable paste. The paste formulation can further include binders, solvents, and so on known and used in the art to make a screen printable paste. It is also possible and contemplated to use a fritted paste formulation, such as a paste containing glass frit, which is particularly applicable where there is a need to penetrate a silicon nitride layer.

The self-doping Ag metallization replaces the heavy phosphorus diffusion step and three metal plating and sintering steps of existing processes with just one step—printing or otherwise disposing a self-doping contact material into the grooves. The resulting process sequence thus requires fewer steps and is much simpler than the traditional buried-contact cell sequence while providing all or virtually all of the same high-efficiency benefits.

Figure 2A:
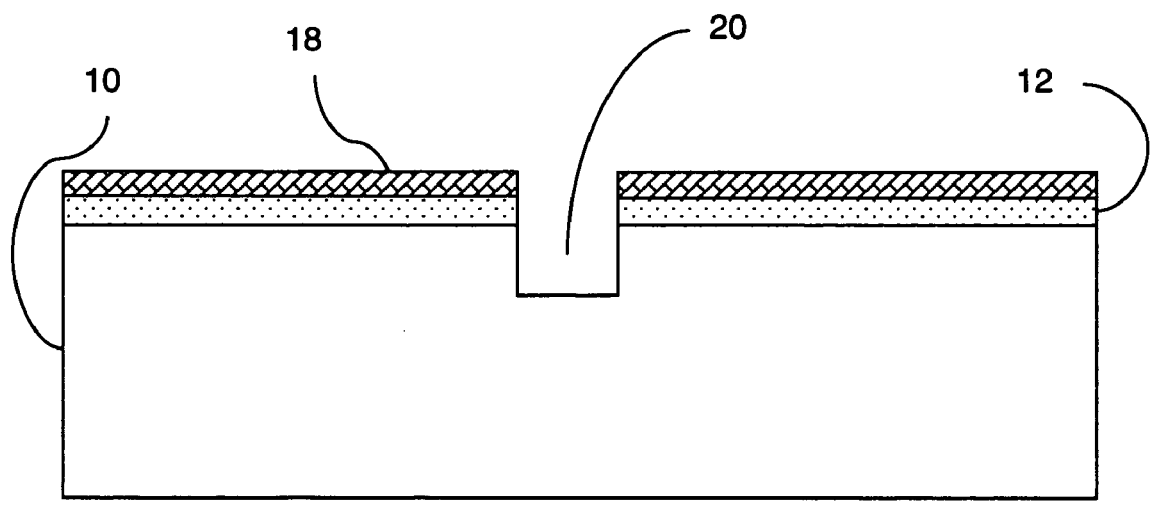
FIG. 2A depicts a cross-section of a silicon substrate with a light phosphorus diffusion and grooving.

In accordance with the present invention, FIG. 2A depicts an undoped groove 20 which has been cut in a silicon substrate 10 with previously applied light phosphorus diffusion 12 layer on the front-surface. The light phosphorus diffusion layer 12 is preferably capped with dielectric layer 18 prior to the groove formation, which dielectric layer 18 functions as an antireflection coating for the solar cell and minimizes the metallurgical reaction between any excess metal printed on the surface outside the groove and diffusion layer 12. The silicon substrate 10 preferably comprises p-type semiconductor silicon, however, other substrates may be employed, including n-type silicon and germanium or silicon-germanium substrates with either conductivity type. The light phosphorus diffusion 12 layer is applied by conventional means, including preferably gas phase diffusion using liquid $POCl_3$. However, other diffusions sources or methods may be used, including application of liquid sources via conventional methods such as coating, dipping or spin-on application, or solid sources, such as with a heating of a solid source material, such as $P_2O_5$, to high temperatures. However, in general, conventional gaseous $POCl_3$ diffusion is preferred.

The grooves 20 may be cut or scribed by any method which will result in a groove of the desired dimension. While use of laser scribing is preferred, other methods may be employed, including etching, mechanical milling and the like. The grooves 20 are longitudinal recesses that run essentially parallel to one another between opposing edges on a surface.

Figure 2B:
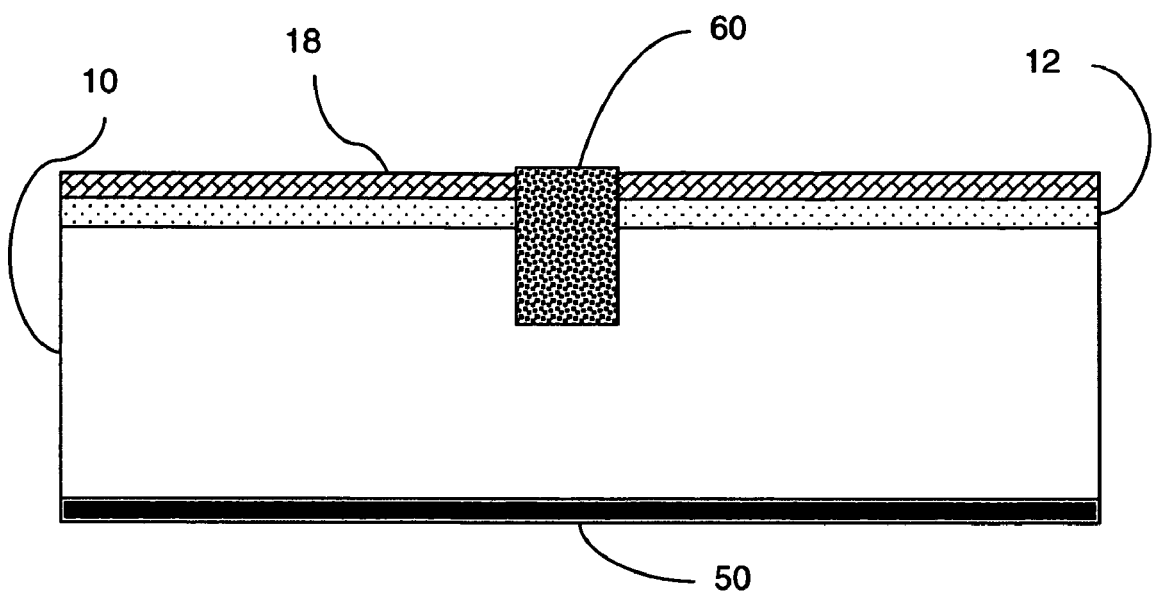
FIG. 2B depicts placement of self-doping metal contact material into a groove according to the present invention.
Figure 2C:
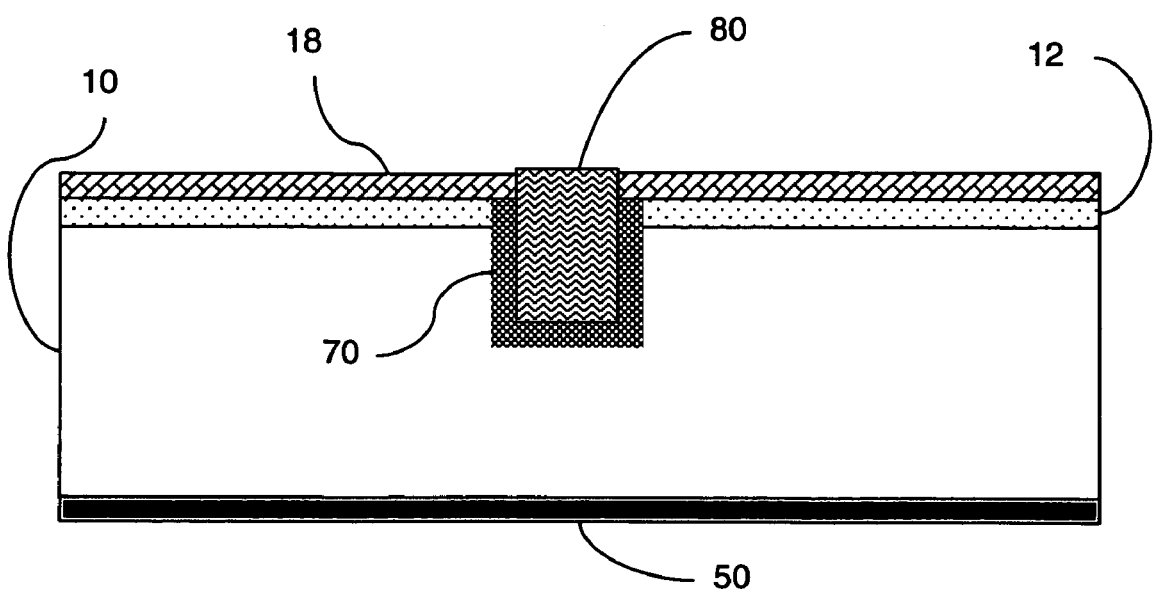
FIG. 2C depicts a cross section of a buried contact solar cell of the present invention subsequent to annealing.

Note that in the drawings, and particularly FIGS. 2A to 2C, the dimensions of the grooves 20, thicknesses of the various layers, and other dimensions are not drawn to scale, but rather are shown schematically for purposes of illustration and easy identification. In general, a buried-contact groove 20 has a depth that is larger than its width, and in a preferred embodiment has a depth that is a multiple of the width. For example, a groove 20 may have a width between about 10 µm and about 50 µm, and preferably about 20 µm, and will have a depth between about 20 µm and about 60 µm (depending in part on the thickness of substrate 10), and preferably about 40 µm. So too the groove 20 may not have a rectilinear cross-section, as shown in FIG. 2A, but may have a rounded bottom, sloping side walls and the like. Parallel grooves 20 are separated by a distance dependant, in part, upon design considerations for the cell. However, any feasible separation is possible, and thus adjacent parallel grooves 20 may be separated by a distance (from center line to center line) of from about 1000 µm to about 3500 µm, and are preferably separated by a distance of from about 1500 µm to about 2500 µm. The thickness of dielectric layer 18 in the completed solar cell (if silicon nitride, with a refractive index of about 2, is used) is preferably approximately 80 nm, and the thickness of diffusion layer 12 is preferably approximately 200 to 1500 nm.

FIG. 2B depicts groove 20 filed with self-doping contact material 60. The self-doping material 60 may be any as described above, including preferably a paste including Ag and a silicon dopant, preferably P. However, self-doping contact material 60 may alternatively be a dried preparation of Ag particles coated with P or another dopant, sequentially applied Ag and dopant (which may be applied either Ag first and dopant second, or dopant first and Ag second), or other formulations of self-doping contact material that can be easily and inexpensively selectively applied into the grooves.

After application of self-doping contact material 60, the self-doping contact material is alloyed with the silicon, preferably by heating or firing at a temperature above the Ag:Si eutectic (845° C.) to produce an Ag grid with a self-doping contact, resulting in a structure as shown in FIG. 2C. The Ag dissolves some of the Si at the interface when the temperature exceeds the eutectic temperature, and the precipitated silicon is doped with phosphorus when the temperature is decreased, resulting in a doped layer of silicon 70 at the inside surface of the groove, with an Ag contact 80 occupying the groove.

An example of a process sequence of the present invention using a single phosphorus diffusion step and a self-doping paste for the grid is as follows:

1. Alkaline etch
2. Light phosphorus diffusion (60 to 100 Ω/sq)
3. HF etch
4. Deposit silicon nitride on front surface
5. Scribe grooves in front surface, preferably using a laser
6. Deposit self-doping paste (e.g., Ag:P) in grooves on front surface
7. Deposit aluminum on rear surface
8. Furnace anneal to alloy Ag and Al contacts simultaneously In the foregoing steps, the alkaline etch serves to clean the surface. Any suitable alkaline etch material may be employed, such as hot or warm sodium hydroxide. By way of example, an aqueous solution of between about 2% and 50% sodium hydroxide by weight may be employed, preferably at temperatures of between about 60° C. and about 95° C.

The light phosphorus diffusion is as described above. Following diffusion, an acid etch step is employed, such as with an aqueous solution of hydrofluoric (HF) acid, preferably with 2 to 50% HF acid by weight. Any conventional method may be employed, including dipping the wafer in a solution containing HF acid. The oxide from the light phosphorus diffusion is preferably, but optionally, removed with an acid such as HF because the oxide can cause reliability problems, particularly with encapsulated photovoltaic modules. Following the HF etch, the bare silicon surface is preferably, but optionally, passivated by deposition of a dielectric layer. Silicon nitride (SiN) may be conventionally deposited by plasma-enhanced chemical vapor deposition (PECVD) or by low-pressure chemical vapor deposition (LPCVD), well-known techniques for passivating silicon surfaces in solar cell fabrication. However, other methods and materials for passivation, if desired, may be employed, such as for example thermally growing a layer of $SiO_2$ or deposition of other dielectric materials, such as $SiO_2$, $TiO_2$, $Ta_2O_5$ and so on, by various means, such as printing, spraying, PECVD or the like.

Following passivation, such as with SiN, if desired, grooves are scribed in the front surface. Preferably a laser is employed, such as a Q-switched Nd:YAG laser. However, mechanical scribing or other means, as described above, may be employed. Optionally after scribing, a cleaning step may be employed, such as with a chemical solution comprising sodium hydroxide or potassium hydroxide.

The grooves 20 are then filled with a self-doping contact material, such as Ag:P paste. Such filing may be by means of screen printing, but other means may be employed. While FIG. 2B shows the self doping contact material 60 filing only the groove and only to a level of the top surface of substrate 10, it is possible and contemplated that the self-doping contact material 60 and resulting contact 80 (as shown in FIG. 2C) may extend above the surface, and may optionally be domed.

For a conventional cell, any metallic back contact may be employed. In a preferred embodiment, as set forth above, an Al back contact is applied. Application of Al prior to annealing the Ag:P paste is a particularly preferred embodiment in that a single furnace annealing step may be employed to simultaneously alloy the Ag in the Ag:P paste forming a part of the buried-contact and the Al forming a back contact. The Al back contact may, for example, be applied by electron beam vaporization, sputtering, screen printing or other techniques.

Step 4, with the addition of additional masking and stripping steps, may optionally be performed after metallization in order to maintain passivation of the SiN layer, which can be affected by high metallization temperatures. Step 5 may alternatively be performed at the start of the process. If the grooves 20 are passivated, such as with SiN, then the self-doping contact material 60 optionally and preferably includes a frit.

In one embodiment, the light phosphorus diffusion may be applied subsequent to scribing of grooves 20. Typically but not necessarily with this approach passivation, such as with SiN, will occur prior to application of self-doping contact material 60, such that a frit is preferably employed. However, this approach has the advantage of providing for an additive effect of n-type dopants within groove 20, that is, the light phosphorus diffusion will result in partial doping of the interior of the groove wall surfaces, with substantial additional n-type doping by means of the use of the self-doping contact material 60. In this way the doping in the groove side walls is substantially greater than surface doping, due to the additive effect of sequential doping steps.

Although the invention has been described in detail with particular reference to these preferred embodiments, other embodiments can achieve the same results. Variations and modifications of the present invention will be obvious to those skilled in the art and it is intended to cover all such modifications and equivalents. The entire disclosures of all references, applications, patents, and publications cited above, and of the corresponding applications, are hereby incorporated by reference.

What is claimed is:

1. A method for making a solar cell, the method comprising the steps of:
   scribing at least one groove in a cell substrate;
   disposing a self-doping contact material within the groove; and
   heating the self-doping contact material, thereby simultaneously doping and metallizing the groove.

2. The method of claim 1 wherein the self-doping contact material comprises a silicon dopant.

3. The method of claim 2 wherein the silicon dopant comprises phosphorus.

4. The method of claim 1 wherein the self-doping contact material comprises silver.

5. The method of claim 1 wherein the self-doping contact material is a paste comprising silver particles and phosphorus.

6. The method of claim 1 wherein the cell substrate comprises a p-type silicon substrate and the self-doping contact material comprises silver and a n-type silicon dopant.

7. The method of claim 1 wherein the cell substrate comprises an n-type silicon substrate and the self-doping contact material comprises silver and a p-type silicon dopant.

8. The method of claim 1 wherein the heating step further comprises alloying rear contacts on a rear surface of the cell.

9. The method of claim 8 wherein the rear contacts comprise aluminum.

10. The method of claim 1 wherein scribing at least one groove comprises scribing a plurality of grooves wherein the depth of the grooves is a multiple of the width of the grooves.

11. A solar cell, made by the method of claim 1.

12. A substrate for making a solar cell comprising:
   a planar semiconductor substrate with a front surface and a back surface, said semiconductor substrate comprising crystalline silicon;
   at least one groove scribed in a surface of the semiconductor substrate; and a self-doping contact material comprising a silicon dopant disposed within said groove, said silicon dopant comprising phosphorus.

13. The substrate of claim 12 wherein the self-doping contact material comprises a paste.

14. The substrate of claim 12 wherein the self-doping contact material comprises silver.

15. The substrate of claim 1 wherein the semiconductor substrate comprises a p-type silicon substrate and the self-doping contact material comprises silver and an n-type silicon dopant.

16. The substrate of claim 12 wherein the semiconductor substrate further comprises a phosphorus diffusion layer on the grooved surface.

17. The substrate of claim 16 further comprising an aluminum layer on the surface opposing the grooved surface.

* * * * *